United States Patent
Kanamaru et al.

(10) Patent No.: US 6,462,925 B2
(45) Date of Patent: *Oct. 8, 2002

(54) EXCESS CURRENT INTERRUPTING STRUCTURE

(75) Inventors: Naoyuki Kanamaru, Takeo (JP); Naoki Motoyama, Takeo (JP); Yoshinori Watajima, Kyoto (JP); Takashi Fujimoto, Takeo (JP); Tetsuya Sawamura, Kishimagun (JP); Nobutomo Matsunaga, Kumamoto (JP); Kazutaka Yoshida, Kyoto (JP); Shuichi Sugimoto, Kyoto (JP); Yoshihisa Toki, Kyoto (JP)

(73) Assignee: Omron Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/324,477

(22) Filed: Jun. 2, 1999

(65) Prior Publication Data

US 2001/0048579 A1 Dec. 6, 2001

(30) Foreign Application Priority Data

Jun. 2, 1998 (JP) ............................................ 10-169225

(51) Int. Cl.[7] .................................................. H02H 3/00
(52) U.S. Cl. ...................... 361/93.8; 361/103; 361/104; 361/93.1

(58) Field of Search .................................. 361/103, 104, 361/93.1, 93.8; 337/142, 158, 159, 161, 182, 186, 222, 227, 290, 293, 295, 296, 401, 403–405, 416

(56) References Cited

U.S. PATENT DOCUMENTS

| 2,302,820 | A | | 11/1942 | Van Leimpt | |
|---|---|---|---|---|---|
| 3,818,408 | A | | 6/1974 | Andersson | |
| 4,547,830 | A | * | 10/1985 | Yamauchi | 361/104 |
| 4,862,134 | A | * | 8/1989 | Poerschke et al. | 337/231 |
| 5,572,181 | A | * | 11/1996 | Kiryu et al. | 337/273 |
| 5,583,740 | A | | 12/1996 | Fujino | |
| 5,644,281 | A | * | 7/1997 | Kuriyama | 337/295 |
| 5,858,454 | A | * | 1/1999 | Kiryu et al. | 427/118 |

FOREIGN PATENT DOCUMENTS

| DE | 296 16 063 | 12/1996 |
|---|---|---|
| EP | 0 364 981 | 4/1990 |
| JP | 34-20549 | 12/1956 |
| JP | 56-43165 | 4/1981 |
| JP | 6-5089 | 1/1994 |
| JP | 07-057616 | 3/1995 |
| JP | 10-134695 | 5/1998 |
| JP | 10-125213 | 5/1999 |

* cited by examiner

Primary Examiner—Stephen W. Jackson
(74) Attorney, Agent, or Firm—Morrison & Foerster LLP (57) ABSTRACT

An excess current interrupting structure comprising a conductive wire rod which generates heat by an excess current connected between a pair of electric conductors, a circumference of the conductive wire rod being covered with a resin with a thin coated layer formed in the vicinity of a path of the conductive wire rod.

10 Claims, 13 Drawing Sheets

PRIOR ART

FIG.17

PRIOR ART

EXCESS CURRENT INTERRUPTING STRUCTURE

BACKGROUND OF THE INVENTION

1. Field of the Invention

The present invention relates to an excess current interrupting structure which shuts off an electric current path connected to a load with high responsiveness and high reliability when the current path receives a current in excess of a predetermined value (referred to hereinafter as an excess current), and more particularly to an excess current interrupting structure which is formed by using a conductive wire which generates heat under the excess current. The wire is made of a good conductor, such as gold, copper and aluminum, has a relatively high resistance in the wire form, is covered with a resin and is placed in a current path such that the path is completely shut off once the excess current flows through the path.

2. Description of the Related Art

Figure 16:
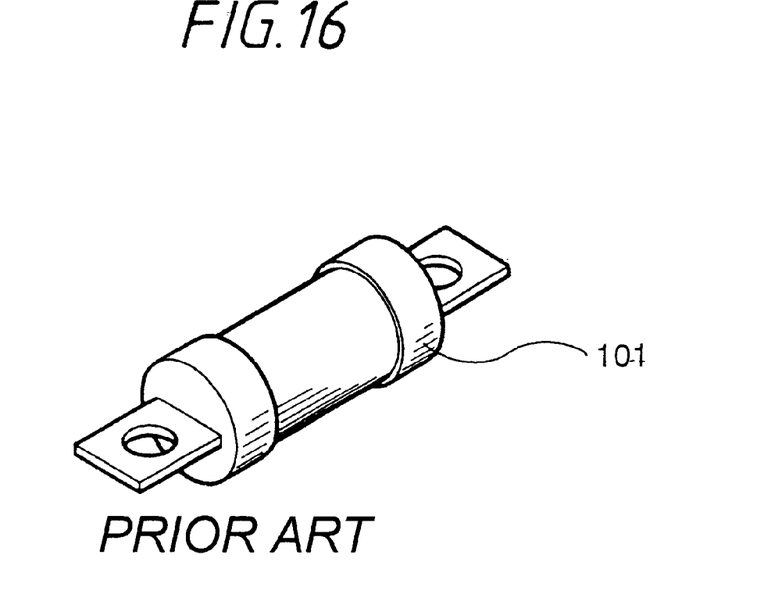
FIG. 16 is a perspective view showing an example of a prior art cartridge type fuse.
Figure 17:
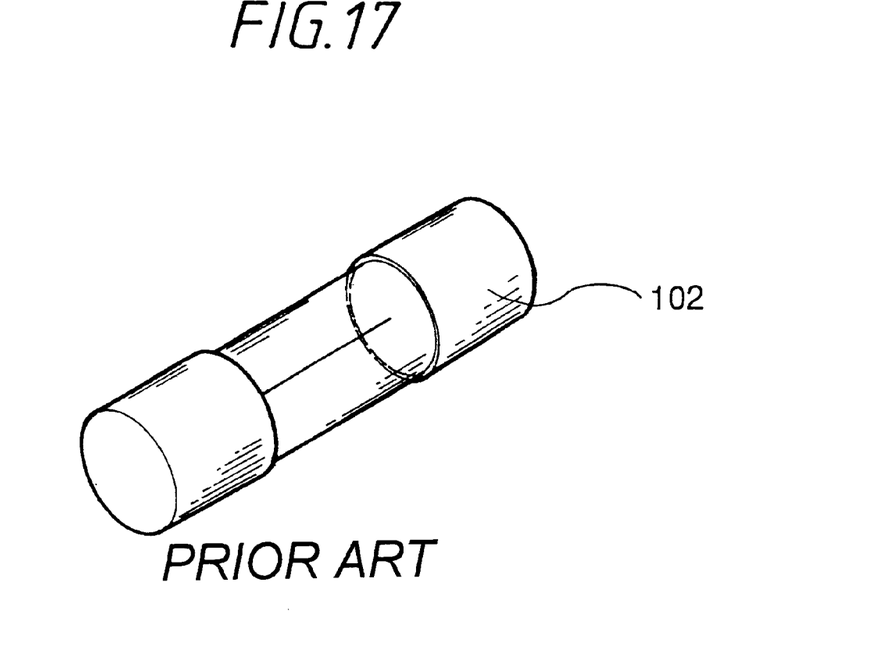
FIG. 17 is a perspective view showing an example of a prior art tubular fuse.

Prior art devices employ fuses, which are inserted in a current path connected to a load, and melt away under an excess current to shut off the current path. As well known in the art, a cartridge fuse 101 of the structure shown in FIG. 16 is used when a target excess current is high, as in the case of a current path connected to a load, and a tubular fuse 102 of the structure shown in FIG. 17 is used with electronic devices of small target excess current. However, these fuses have the following problems:

(1) The cartridge fuse 101 has a complicated construction, a high degree of difficulty in manufacturing and a high price, so that it causes a large cost increase in the overload protection of a current path connected to the load.

(2) Both the cartridge fuse 101 and the tubular cartridge 102 use a fuse holder, so that when they are placed in an electronic device, they occupy a large space.

The new excess current interrupting structure of this invention uses a conductive wire which generates heat when an excess current flows through it. The wire is made of a good conductor, such as gold, copper or aluminum, has a relatively high resistance in the wire form, is covered with a resin, and is placed in a current path such that the path is completely shut off once the excess current flows through the path. This enables both securing of the capacity of an electric current path (heat radiation to the surrounding of the path) and fixing of a pair of electric conductors (for example, terminals) connected to the conductive wire. In addition, this structure is advantageous in view of its ease of handling, resistance to the environment and insulating characteristics with respect to peripheral parts.

However, in the case of a prior art structure in which the circumference of a conductive wire is coated with a resin, it should be noted that the carbonization of the resin around the conductive wire occurs when the conductive wire is melted under an excess current. This carbonized portion forms a bypass electric current path (carbonized path). Thus, even when the conductive wire is melted by the excess current, the bypass electric current path formed by the carbonized portion remains, and the excess current continues to be supplied to the load. Therefore, the prior art structures in which the circumference of the conductive wire is coated with a resin are impractical.

SUMMARY OF THE INVENTION

The present invention aims at providing a practical excess current interrupting structure in which the circumference of a conductive wire is coated with resin and shuts off with high responsiveness and high reliability an electric current path in which an excess current flows.

This invention is directed to providing an excess current interrupting structure comprising a conductive wire which generates heat under an excess current and connects a pair of electric conductors. The circumference of the conductive wire is covered by a thin resin layer formed in the vicinity of the path of the conductive wire.

In the invention, when the conductive wire connecting a pair of electric conductors generates heat under an excess current, causing the temperature thereof to increase, with the resin layer also generating heat at the same time to cause the temperature thereof to increase, the temperature rise in the resin layer is concentrated in the section over which the thin coated portion is formed. As a result, thermal stress and a large quantity of gas form upon the carbonization of the resin in the section of the thin resin layer, rather than in the section which has a thick resin coating. In other words, the rate of increase in thermal stress and gas pressure in the section of the thin resin layer is sharper than the increase in the thermal stress and the pressure in the section of the resin layer which is thicker.

Therefore, when a carbonized path is formed because of the carbonization of the resin around the conductive wire under an excess current, the thermal stress and gas pressure reach a critical bursting pressure in the section of the thinner resin coating and burst the section on a small scale. In the meantime, the thermal stress and gas pressure remain well short of the bursting pressure of the section of the thicker resin coating. Consequently, the section of thin resin layer is instantaneously destroyed, together with the carbonized path. Typically, a crack forms in the section of the thin resin layer when the bursting takes place, and it does not matter whether the conductive wire is melted by the excess current. As a result, when a load current flowing in the current path between a pair of electric conductors reaches an excess current level, the current path in the section of thin resin layer is shut off with high responsiveness and high reliability while the section of thicker resin coating remains undestroyed. In addition, the thickness of coating of the section of thin resin layer may be regulated so that the shut-off time for the current path is adjusted accordingly.

The conductive wire of this invention comprises a thin metal wire made of a conductive metal of a high electric conductivity. This enables flexibility in placement of the conductive wire in a device.

Furthermore, the excess current interrupting structure of this invention may have a plurality of conductive wires connecting the pair of electric conductors. This enables the expansion of the heat generation region under the excess current flow between the pair of electric conductors, thus expanding the destruction starting region. In this configuration, the diameter of the electric wire changes inversely in proportion to the number of the wires.

Still further, in this invention, the material and volume of the conductors are selected so that the generation of heat under the excess current concentrates at the conductive wire. This enables heat generation with high responsiveness when the excess current flows in the current path.

Furthermore, in this invention, the conductors are of a shape suitable for mounting on a circuit board so that standard surface mounting techniques are used in accordance with standard surface mounting specifications. It is also possible that the thinner resin coating is formed by transfer molding using a metal mold, resulting in a much simpler production process. The excess current interrupting structure of this invention may also include a sensor for detecting a change in a condition of the device. Such a sensor may be made of temperature sensing material and a physical force sensing material. Such a sensor may change its color under heat or stress so that the change is recognized even when the destruction of the excess current interrupting structure is not clearly visible.

DETAILED DESCRIPTION OF THE PREFERRED EMBODIMENTS

Preferred modes of the embodiments of this invention will now be described in reference to the drawings described above.

Figure 1:
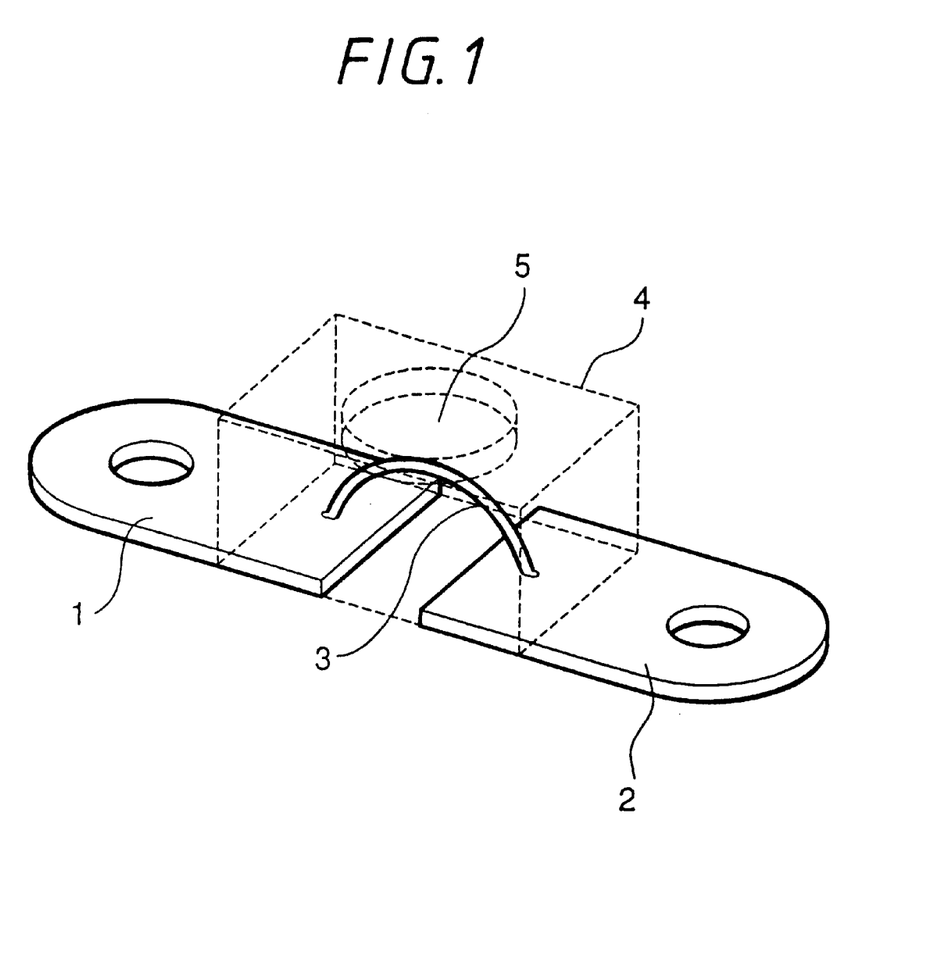
FIG. 1 is a schematic perspective view showing the construction of a first embodiment of the excess current interrupting structure according to the invention.

The schematic perspective view of FIG. 1 shows the construction of a first embodiment of the excess current interrupting structure according to the invention. Referring to the drawing, reference numerals 1 and 2 denote electrodes of a terminal structure which constitute a pair of electric conductors, and reference numeral 3 denotes a conductive wire made of a metal of a high electric conductivity, for example, gold, copper or aluminum. The diameter of the wire is small enough to form a relatively high resistance and is adapted to generate heat under an excess current. The diameter of the wire used in the first embodiment was 50 $\mu$m for the gold wire and 300 $\mu$m for the aluminum wire. Also, reference numerals 4 and 5 denote a thick resin layer and a thin resin layer, respectively.

In the excess current interrupting structure of the first embodiment, the conductive wire 3 connecting the pair of electrodes 1, 2 and generating heat under the excess current is formed by wire bonding, and the resin layer 4 is formed by coating a resin, for example, an epoxy resin, using transfer mold technique with a metal mold, which seals the circumference of the conductive wire 3. When the resin layer 4 is formed, the thin resin layer 5 is formed at the same time by forming a circular dent in the vicinity of the path of the conductive wire 3. The depth of the dent above the thin resin layer 5 is adjusted so that the conductive wire 3 is not exposed. The configuration shown in FIG. 1 has a depth of about 0.5 mm.

The material and size (or volume) of the electrodes are selected so that they have a low resistance and a high heat capacity. As a result, the heat generation concentrates at the conductive wire 3 when an excess current follows between the two electrodes 1, 2. Accordingly, the conductive wire 3 generates heat with a high degree of responsiveness.

When the conductive wire 3 connecting the electrodes 1, 2 generates heat to increase the temperature, the generated heat concentrates at the thin resin layer 5 because of the structure described above. During this heating, thermal stress and a large quantity of gas form because of the carbonization of the resin in the resin coating, especially, in the thin resin layer 5.

Therefore, when a carbonized path is formed because of the carbonization of the resin around the conductive wire 3 under an excess current, the thermal stress and gas pressure reach a critical bursting pressure in thin resin layer 5 and burst the thin resin layer 5 on a small scale. In the meantime, the thermal stress and gas pressure remain well short of the bursting pressure in the section of the resin layer 4, which is thicker than the thin resin layer 5. Consequently, the section of thin resin layer 5 is instantaneously destroyed, together with the carbonized path. Typically, a crack forms in the section of the thin resin layer 5 upon bursting, and it does not matter whether the conductive wire 3 is melted by the excess current. As a result, when a load current flowing in the current path between the pair of electric conductors 1, 2 has become an excess current, the current path in the thin resin layer 5 is shut off with high responsiveness and high reliability while the resin layer 4 remains undestroyed. In addition, the following advantages arise:

(1) The shut-off time for the current path is adjusted by regulating the thickness of the thin resin layer 5.

(2) The placement of the conductive wire in a device can accommodate various device designs.

(3) The resin layer is advantageous in view of ease of handling, resistance to the environment, and insulating characteristics with respect to peripheral parts.

(4) Since the resin layer 4 including the thin resin layer 5 is formed when the conductive wire connecting the electric conductors is formed by transfer mold using a metal mold, the production process is simplified. Since the excess current interrupting structure can be manufactured by utilizing a general semiconductor package production line, the capacity of manufacturing the same is improved, and the decrease in cost is significant.

FIGS. 2–7 show variations of the first embodiment of this invention for improving the responsiveness with witch the thin resin layer 5 is destroyed by the heat generation of the conductive wire 3.

Figures 2A, 2B:
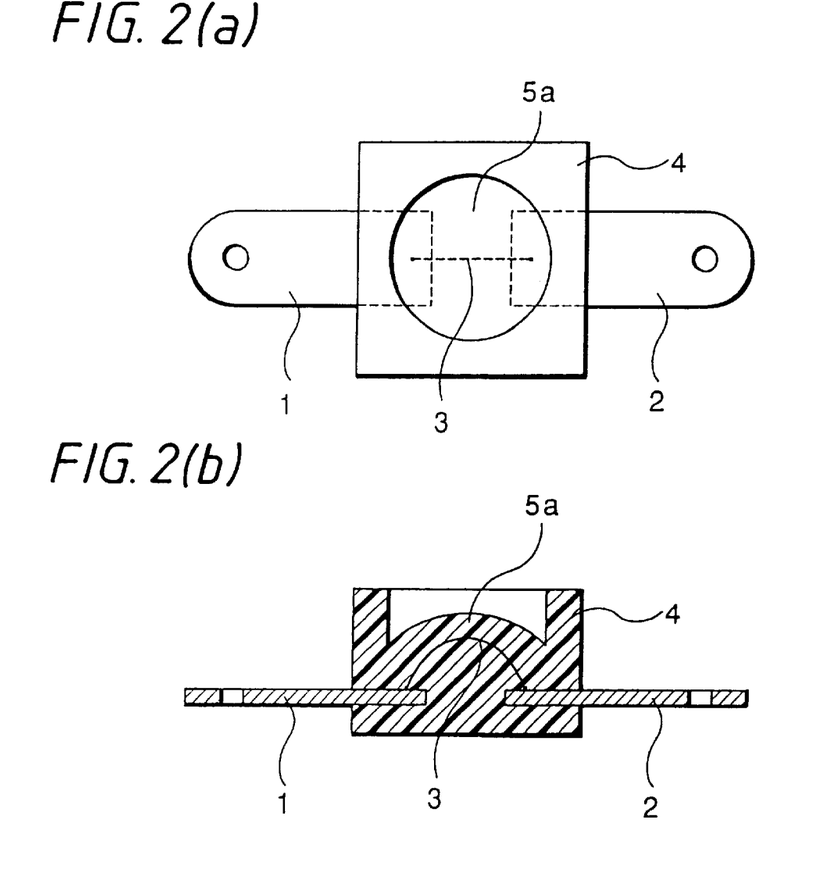
FIGS. 2(a) and 2(b) show a first variation of the first embodiment of the excess current interrupting structure according to the invention.

In the first variation shown in the top view of FIG. 2(a) and the cross-sectional view of FIG. 2(b), the thin resin layer 5a is curved along the shape of the conductive wire 3 bonded between the two electrodes 1, 2. This configuration promotes crack propagation in a direction perpendicular to the conductive wire 3 upon the generation of heat due to the excess current, resulting in an improved responsiveness with which the thin resin layer is destroyed.

Figure 3:
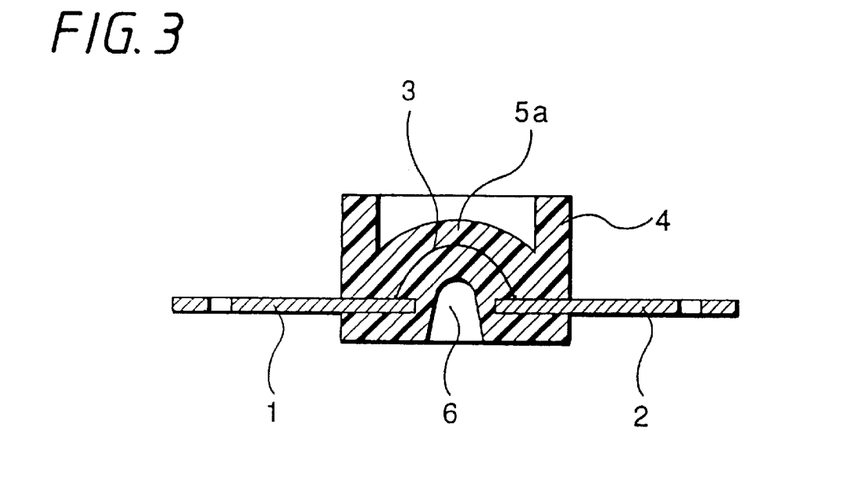
FIG. 3 shows a modification of the first variation of the first embodiment of the excess current interrupting structure according to the invention.

One modification of the first variation is shown in the cross-sectional view of FIG. 3. This modification is that a grove 8 is formed on the back side of the thin resin layer 5 in the resin layer 4. This configuration further reduces the thickness of the thin resin layer 5 and further promotes crack propagation in the direction perpendicular to the conductive wire 5. Accordingly the responsiveness with which the thin resin layer is destroyed further improves.

Figures 4A, 4B:
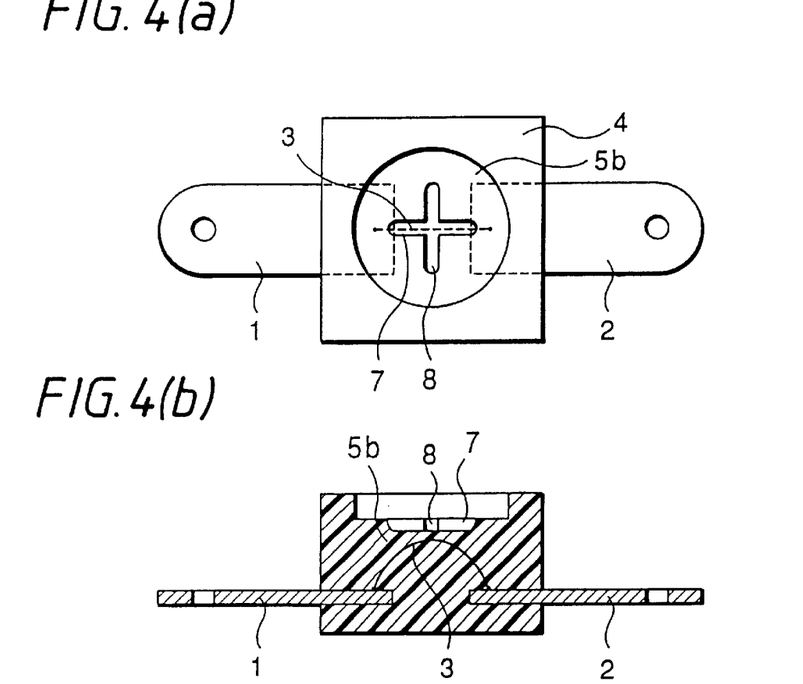
FIGS. 4(a) and 4(b) show a second variation of the first embodiment of the excess current interrupting structure according to the invention.

The second variation of the first embodiment is shown in the top view of FIG. 4(a) and the cross-sectional view of FIG. 4(b). The difference is that two grooves 7, 8 are formed on the surface of the thin resin layer 5b. Groove 7 is formed in the direction along the conductive wire 3 and groove 8 is formed perpendicular to the groove 7. This configuration introduces a weaker structure at the thin resin layer 5b to promote crack propagation in the direction perpendicular to the conductive wire 5. Accordingly the responsiveness with which the thin resin layer 5b is destroyed improves.

Figures 5A, 5B:
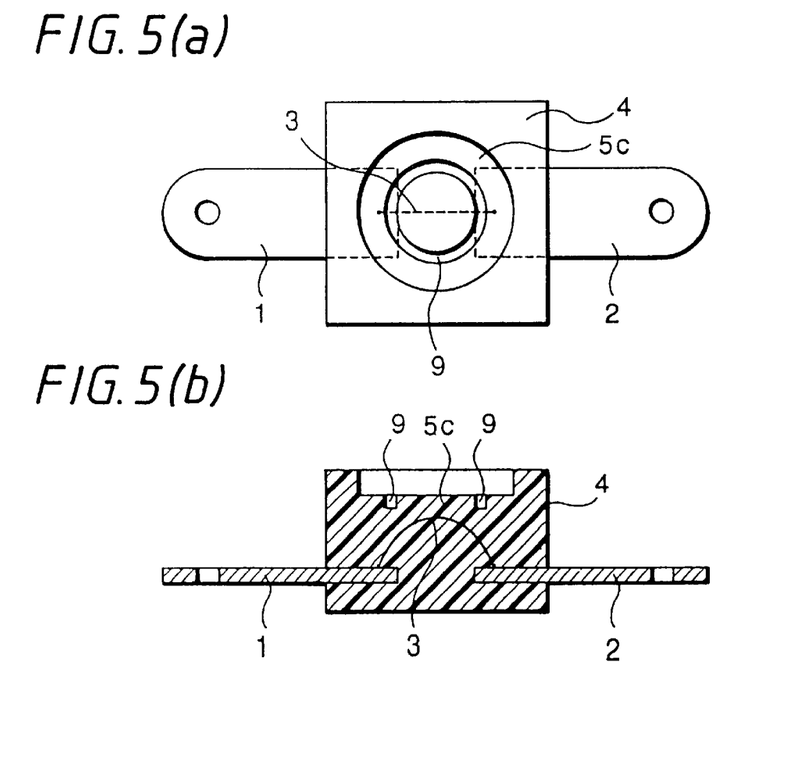
FIGS. 5(a) and 5(b) show a third variation of the first embodiment of the excess current interrupting structure according to the invention.

The third variation of the first embodiment is shown in the top view of FIG. 5(a) and the cross-sectional view of FIG. 5(b). The difference is that a circular groove 9 is formed on the surface of the thin resin layer 5c. This configuration introduces a weaker structure at the thin resin layer 5c to promote the crack propagation, resulting in an improved responsiveness with which the thin resin layer 5c is destroyed.

Figures 6A, 6B:
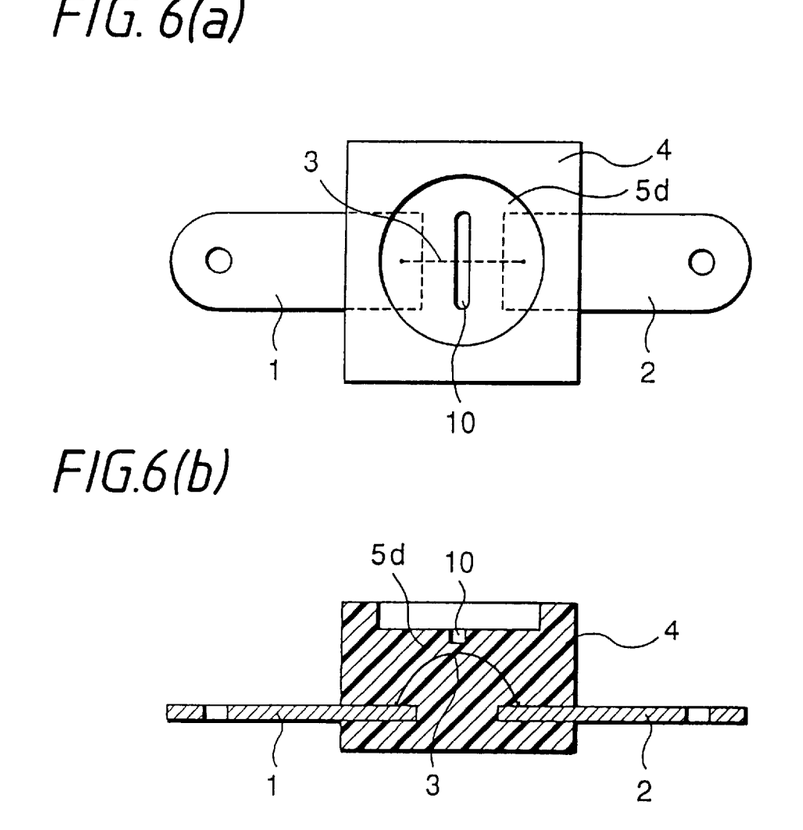
FIGS. 6(a) and 6(b) show a fourth variation of the first embodiment of the excess current interrupting structure according to the invention.
Figure 7:
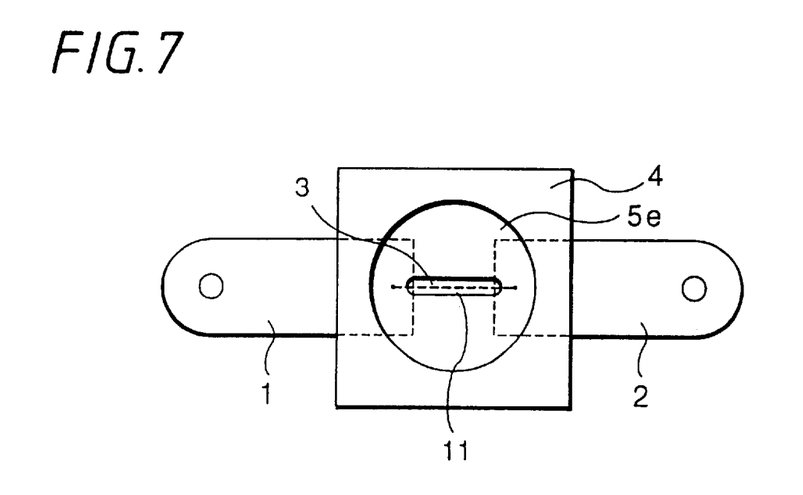
FIG. 7 shows a modification of the second variation of the first embodiment of the excess current interrupting structure according to the invention.

The fourth variation of the first embodiment is shown in the top view of FIG. 6(a) and the cross-sectional view of FIG. 6(b). The difference is that a groove 10 is formed on the surface of the thin resin layer 5d in a direction perpendicular to the conductive wire 3. This configuration introduces a weaker structure at the thin resin layer 5d to promote crack propagation, resulting in an improved responsiveness with which the thin resin layer 5d is destroyed. As a modification to this variation, a groove 11 may be formed in the direction of the conductive wire 3, rather than in a direction perpendicular to the conductive wire 3, as shown in FIG. 7. Similarly, such a configuration results in an improved responsiveness with which the thin resin layer 5e is destroyed.

Figure 8:
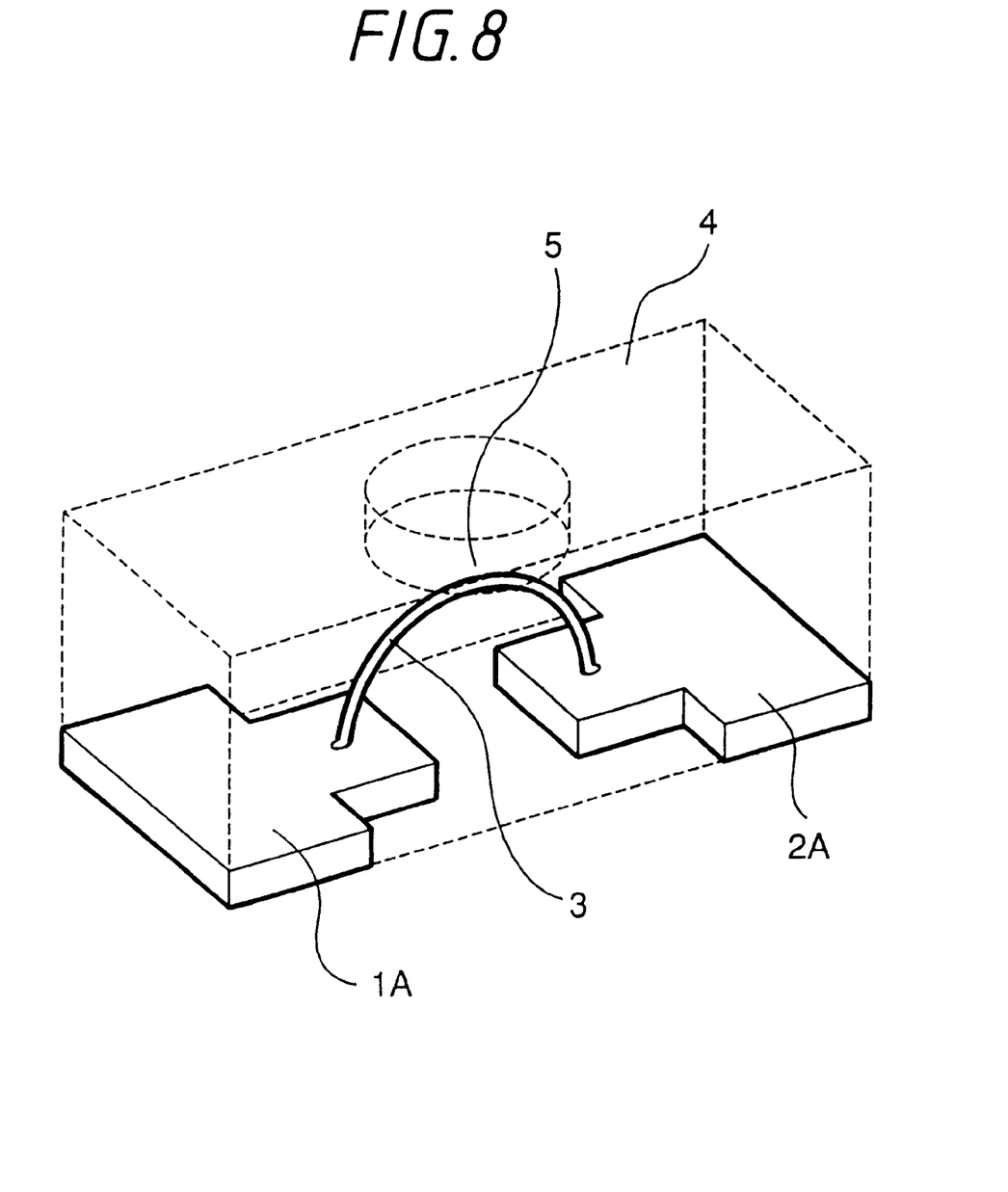
FIG. 8 is a schematic perspective view showing the construction of a second embodiment of the excess current interrupting structure according to the invention.

The schematic perspective view of FIG. 8 shows the second embodiment of the excess current interrupting structure of this invention. This configuration is similar to the configuration of the first embodiment except that a pair of SMD electrodes 1A, 2A are employed and embedded in the resin layer 4.

The configuration of the second embodiment also has the thin resin layer 5 at the section of the conductive wire 3, which is formed simultaneously as the resin layer 4. The section of the thin resin layer 5 is instantaneously destroyed, together with the carbonized path. Typically, a crack forms in the section of the thin resin layer 5 upon the bursting, and it does not matter whether the conductive wire 3 is melted by the excess current. As a result, when a load current flowing in the current path between the pair of electrode terminals 1A, 2A has become an excess current, the current path in the thin resin layer 5 is shut off with high responsiveness and high reliability. One of the advantages of this embodiment is that it can be easily mounted on a semiconductor circuit pattern using conventional surface mounting techniques.

Figure 9A:
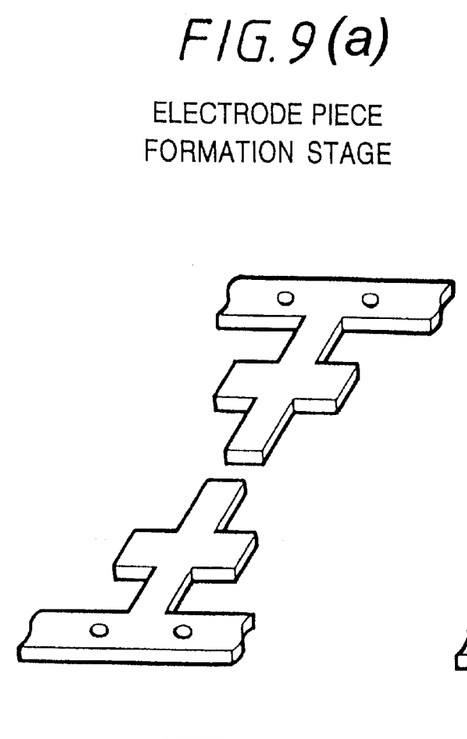
FIGS. 9(a)–9(c) show the manufacturing stages for the second embodiment of the excess current interrupting structure according to the invention.
Figure 9B:
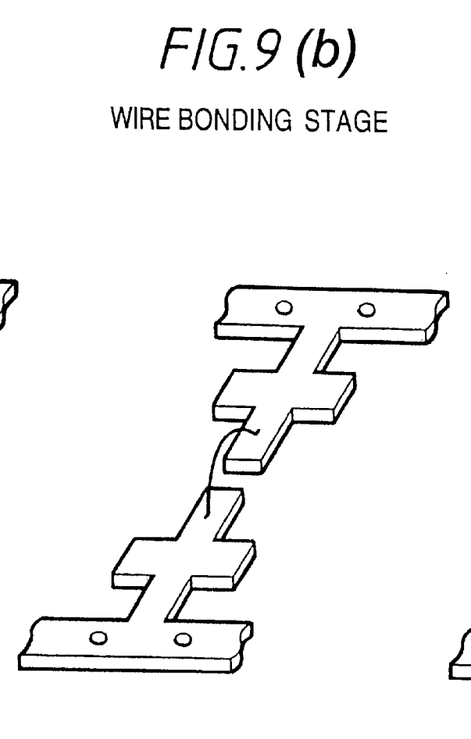
Figure 9C:
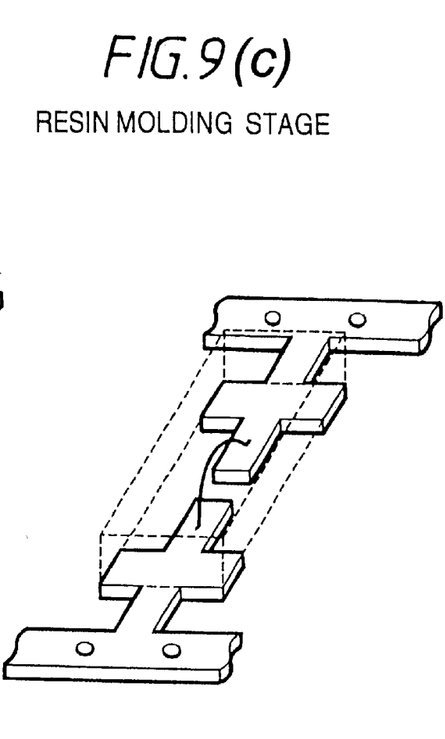

FIGS. 9(a)–(c) show a manufacturing process for the excess current interrupting structure of the second embodiment. The process includes an electrode formation stage (a), a wire bonding stage (b), and a resin molding stage (c), in this order from the upstream to the downstream of the process. The lead frames shown in the figure undergoes the process and formed into the device shown in FIG. 8 by cutting unnecessary portions of the lead frames.

Figure 10:
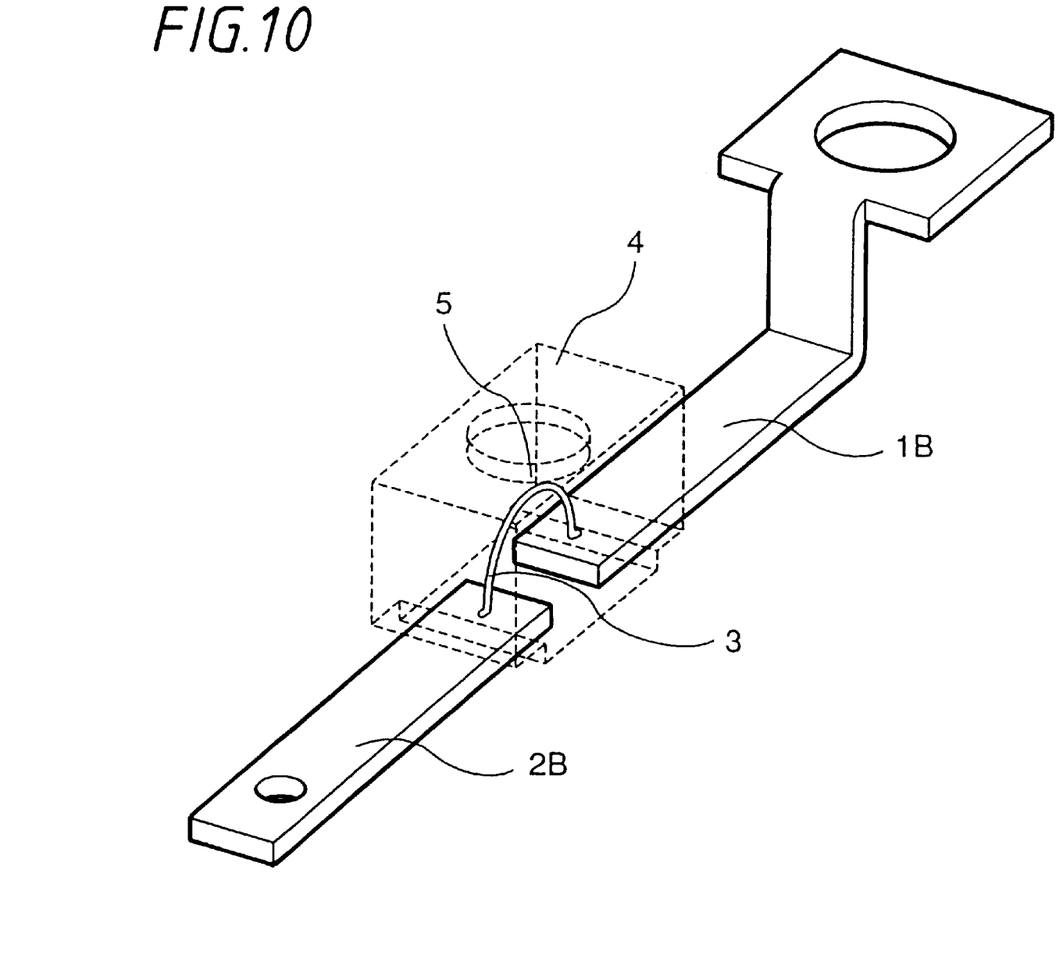
FIG. 10 is a schematic perspective view showing the construction of a third embodiment of the excess current interrupting structure according to the invention.
Figures 11A, 11B, 11C, 11D:
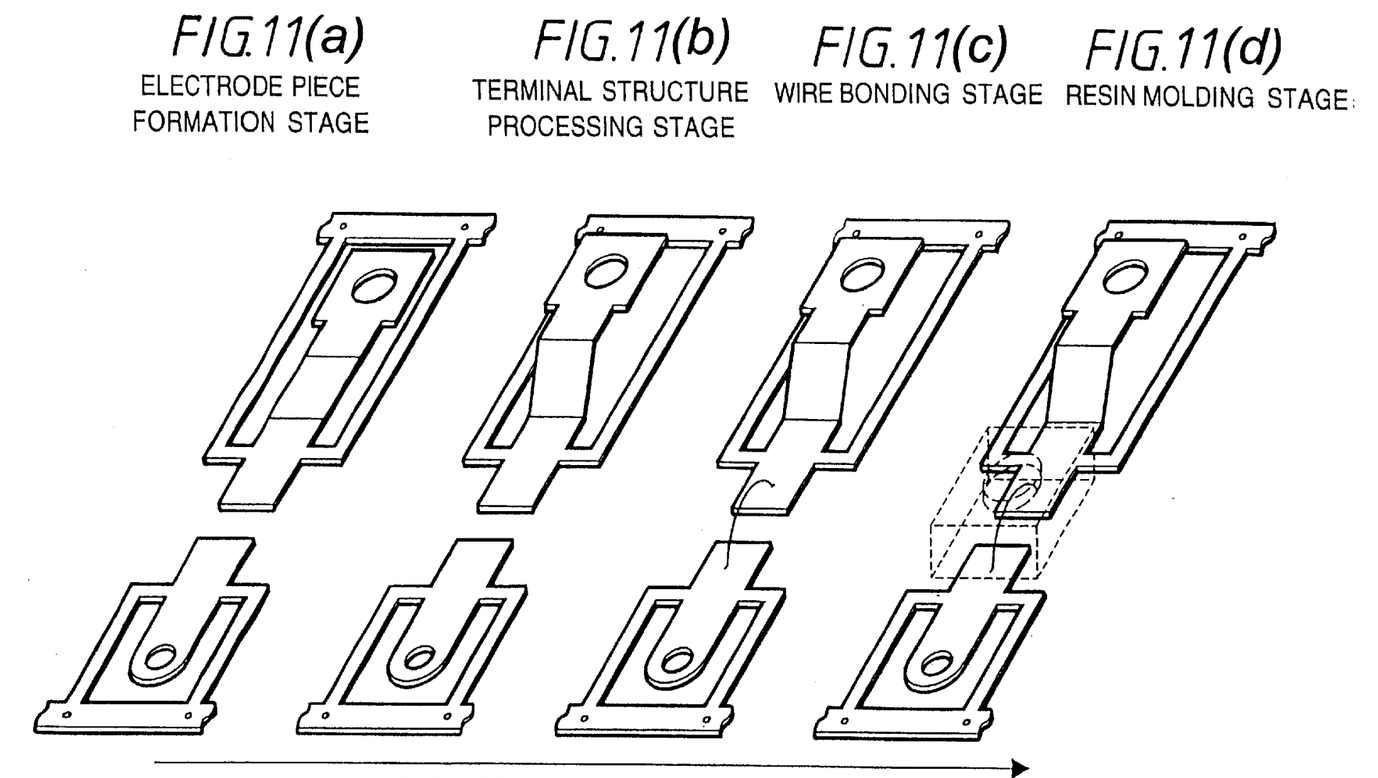
FIGS. 11(a)–11(d) show the manufacturing stages for the third embodiment of the excess current interrupting structure according to the invention.

The schematic perspective view of FIG. 10 shows the third embodiment of the excess current interrupting structure of this invention. This configuration is similar to the configuration of the first embodiment except that one of the pair of the electrodes 1B has a terminal portion and a necessary lead portion for the terminal, as shown in the figure.

The configuration of the third embodiment also has the thin resin layer 5 at the section of the conductive wire 3, which is formed simultaneously with the resin layer 4. The section of the thin resin layer 5 is instantaneously destroyed, together with the carbonized path. Typically, a crack forms in the section of the thin resin layer 5 upon the bursting, and it does not matter whether the conductive wire 3 is melted by the excess current. As a result, when a load current flowing in the current path between the pair of electrode terminals 1B, 2B has become an excess current, the current path in the thin resin layer 5 is shut off with high responsiveness and high reliability.

FIGS. 11(a)–(d) show a manufacturing process for the excess current interrupting structure of the third embodiment. The process includes an electrode formation stage (a), a terminal formation stage (b), a wire bonding stage (c) and a resin molding stage (d), in this order from the upstream to the downstream of the process. The lead frame shown in the figures undergoes the process and is formed into the device shown in FIG. 10 by cutting off unnecessary portions of the lead frames.

Figure 12A:
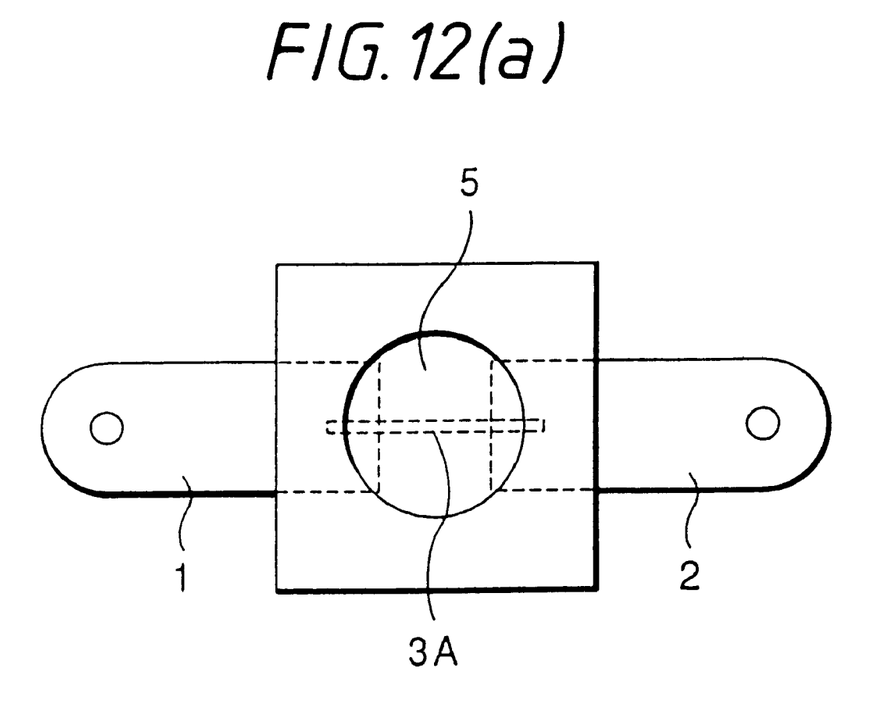
FIGS. 12(a) and 12(b) show the construction of a fourth embodiment of the excess current interrupting structure according to the invention.
Figure 12B:
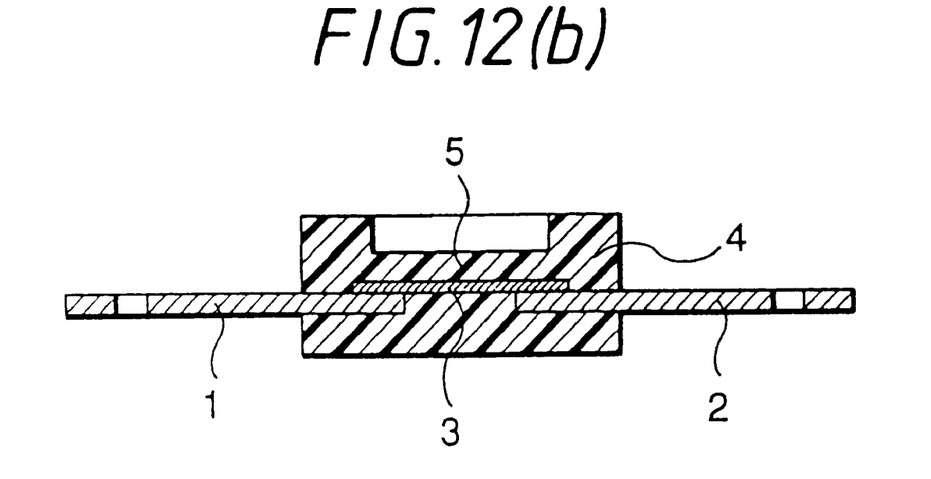

The top view FIG. 12(a) and the cross-sectional view FIG. 12(b) show the fourth embodiment of the excess current interrupting structure of this invention. This configuration is similar to the configuration of the first embodiment except that the conductive wire is replaced by a conductive material of a straight rod-like shape 3A. As in the previous embodiments, the conductive wire 3 takes a curved form because it is fixed onto the electrodes using a wire-bonding technique. The rod 3A may be made of the conductive wire 3, or thin foil made of a conductive material.

The configuration of the fourth embodiment also has the thin resin layer 5 at the section of the conductive rod 3A, which is formed simultaneously with the resin layer 4. The section of the thin resin layer 5 is instantaneously destroyed, together with the carbonized path. Typically, a crack forms in the section of the thin resin layer 5 upon the bursting, and it does not matter whether the conductive rod 3A is melted by the excess current. As a result, when a load current flowing in the current path between the pair of electrode terminals 1, 2 has become an excess current, the current path in the thin resin layer 5 is shut off with high responsiveness and high reliability. Furthermore, the overall size of the device can be reduced because of the straight shape of the conductive rod 3A.

Figure 13:
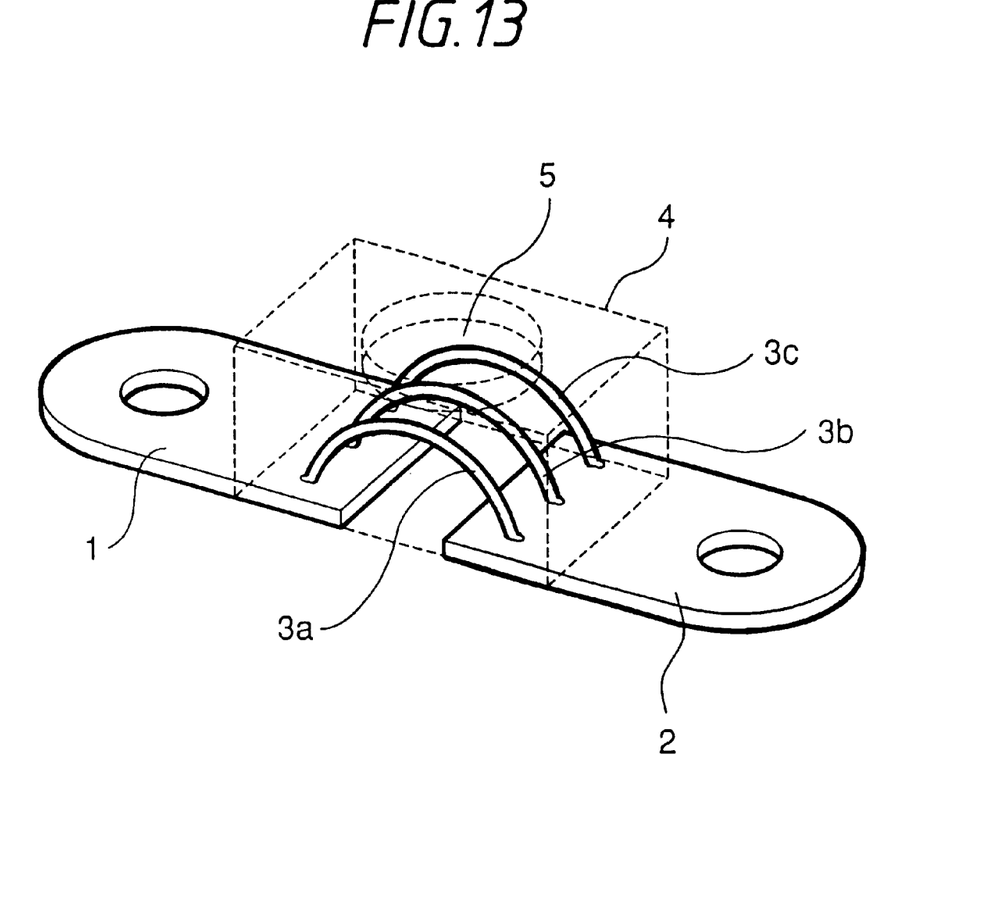
FIG. 13 is a schematic perspective view showing the construction of a fifth embodiment of the excess current interrupting structure according to the invention.

The schematic perspective view of FIG. 13 shows the fifth embodiment of the excess current interrupting structure of this invention. This configuration is similar to the configuration of the first embodiment except that a plurality of conductive wires 3a, 3b, 3c connect the two electrodes 1, 2. This configuration expands the area for the heat generation under the excess current, and accordingly the destruction of the thin resin layer 5 may start from more than a single point. In this configuration, the diameter of the conductive wire 3 is inversely proportional to the number of the wires connecting the electrodes.

Figure 14:
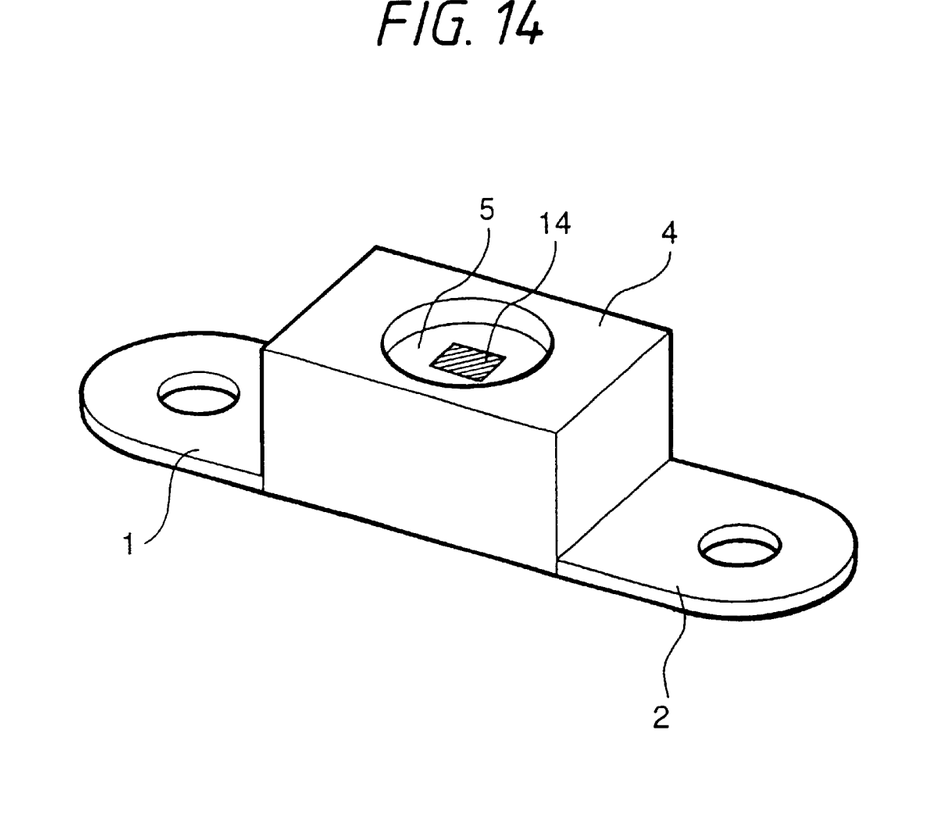
FIG. 14 is a schematic perspective view showing the construction of a sixth embodiment of the excess current interrupting structure according to the invention.

The schematic perspective view of FIG. 14 shows the sixth embodiment of the excess current interrupting structure of this invention. This configuration is similar to the configuration of the first embodiment except that a temperature sensor 14 is placed on the surface of the thin resin layer 5. The sensor may be made of a thermosensible material such as a thermal tape, which changes its color upon change in temperature. Even when the destruction of the thin resin layer 5 is not readily visible, the change in color of the material placed on the surface of the thin resin layer 5 is easily recognized as an indication of the destruction. The sensor 14 may be also embedded in the resin.

Figure 15:
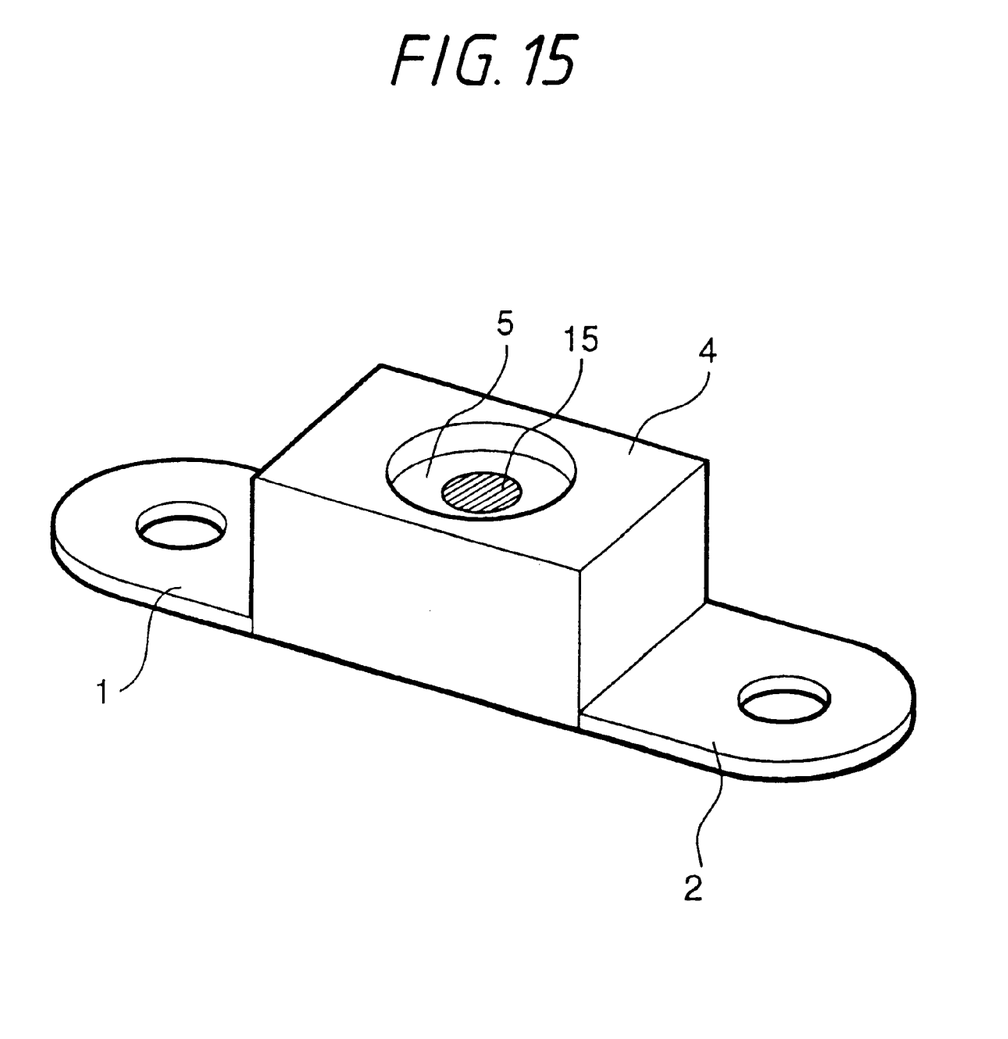
FIG. 15 is a schematic perspective view showing the construction of a seventh embodiment of the excess current interrupting structure according to the invention.

The schematic perspective view of FIG. 15 shows the seventh embodiment of the excess current interrupting structure of this invention. This configuration is similar to the configuration of the first embodiment except that a stress sensor 15 is placed on the surface of the thin resin layer 5. The sensor may be made of a stress-sensible material such as a stress-sensible paper, which changes its color upon the change of the stress applied to the paper. Even when the destruction of the thin resin layer 5 is not readily visible, the change in color of the material placed on the surface of the thin resin layer 5 is easily recognized as an indication of the destruction. The sensor 15 may be also embedded in the resin.

As described above, the excess current interrupting structure of this invention can be used as a component in an electric circuit, and shut off the current path to which the structure is inserted with high responsiveness and high reliability.

What is claimed is:

1. An excess current interrupting structure, comprising:
   a plurality of electrical conductors;
   an electrically conductive wire connected between at least a pair of the electric conductors; and
   a resin body between the pair of electrical conductors covering the electrically conductive wire and having a recessed portion formed on a side thereof that defines a thin layer of resin over the electrically conductive wire;
   the excess current interrupting structure being configured so that a current flow through the electrically conductive wire in excess of a predetermined level causes destruction of the thin resin layer over the electrically conductive wire and interruption of the electric current without regard to melting or destruction of the electrically conductive wire by the current flow in excess of a predetermined level.

2. The excess current interrupting structure of claim 1, further comprising a second recessed portion formed over the electrically conductive wire in a second side of the resin body.

3. The excess current interrupting structure of claim 1, further comprising a second recessed portion formed over the electrically conductive wire in the recessed portion of the resin body.

4. The excess current interrupting structure of claim 1, further comprising a second electrically conductive wire connected between the electrical conductors.

5. The excess current interrupting structure of claim 1, wherein the electrically conductive wire is made from a metal selected from the group consisting of gold, copper and aluminum.

6. The excess current interrupting structure of claim 1, further comprising an abnormality indicator on the thin resin layer.

7. The excess current interrupting structure of claim 6, wherein the abnormality indicator comprises a temperature sensing substance.

8. The excess current interrupting structure of claim 6, wherein the abnormality indicator comprises a physical force sensing substance.

9. The excess current interrupting structure of claim 1, wherein the configuration of the electrical conductors is chosen so as to concentrate buildup of heat caused by the current flow in excess of a predetermined level on the electrically conductive wire.

10. The excess current interrupting structure of claim 1, wherein the electrical conductors are configured in a shape prescribed by surface mounting specifications.

* * * * *